(12) United States Patent
Kimbara et al.

(10) Patent No.: US 9,306,538 B2
(45) Date of Patent: Apr. 5, 2016

(54) COMPOSITE ELECTRONIC COMPONENT

(71) Applicant: TAIYO YUDEN CO., LTD., Tokyo (JP)

(72) Inventors: Kanehisa Kimbara, Kanagawa (JP); Osamu Kawachi, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 212 days.

(21) Appl. No.: 13/759,402

(22) Filed: Feb. 5, 2013

(65) Prior Publication Data

US 2013/0307636 A1 Nov. 21, 2013

(30) Foreign Application Priority Data

May 15, 2012 (JP) .................. 2012-111936

(51) Int. Cl.
| | | |
|---|---|---|
| H01L 41/00 | (2013.01) | |
| H03H 9/46 | (2006.01) | |
| H03H 9/70 | (2006.01) | |
| H03H 9/05 | (2006.01) | |
| H05K 1/02 | (2006.01) | |
| H05K 1/18 | (2006.01) | |
| H05K 1/11 | (2006.01) | |

(52) U.S. Cl.
CPC .............. *H03H 9/46* (2013.01); *H03H 9/0542* (2013.01); *H03H 9/70* (2013.01); *H05K 1/0271* (2013.01); *H05K 1/181* (2013.01); *H05K 1/113* (2013.01); *H05K 2201/1006* (2013.01); *H05K 2201/10068* (2013.01); *H05K 2201/10204* (2013.01); *H05K 2201/2045* (2013.01)

(58) Field of Classification Search
USPC .................. 333/133, 193, 195, 186; 257/774; 310/340, 313 B, 313 R, 313 A; 174/255
See application file for complete search history.

(56) References Cited

U.S. PATENT DOCUMENTS

| | | | |
|---|---|---|---|
| 6,762,495 B1 * | 7/2004 | Reyes et al. .................... 257/737 |
| 2001/0040487 A1 * | 11/2001 | Ikata et al. ..................... 333/133 |
| 2002/0043899 A1 * | 4/2002 | Kishimoto ........... H03H 9/0576 310/348 |
| 2009/0091904 A1 | 4/2009 | Hatanaka et al. |
| 2013/0119552 A1 * | 5/2013 | Lin ..................... H01L 25/0652 257/774 |

FOREIGN PATENT DOCUMENTS

| | | |
|---|---|---|
| JP | 2002-198774 A | 7/2002 |
| JP | 2007-180529 A1 | 7/2007 |
| WO | 2007/114224 A1 | 10/2007 |

OTHER PUBLICATIONS

Japanese Office Action dated Nov. 4, 2015, in a Japanese patent application No. 2012-111936.

* cited by examiner

*Primary Examiner* — Lincoln Donovan
*Assistant Examiner* — Thomas Skibinski
(74) *Attorney, Agent, or Firm* — Chen Yoshimura LLP

(57) ABSTRACT

A composite electronic component includes: a circuit board; a package that includes an acoustic wave filter and is located on a top surface of the circuit board; a dummy package that is located on the top surface of the circuit board; and a lid that is located above the package and the dummy package.

16 Claims, 9 Drawing Sheets

COMPOSITE ELECTRONIC COMPONENT

CROSS-REFERENCE TO RELATED APPLICATION

This application is based upon and claims the benefit of priority of the prior Japanese Patent Application No. 2012-111936, filed on May 15, 2012, the entire contents of which are incorporated herein by reference.

FIELD

A certain aspect of the present invention relates to a composite electronic component.

BACKGROUND

Acoustic wave resonators such as surface acoustic wave (SAW) resonators and piezoelectric thin film resonators are used as filters or duplexers having excellent high-frequency characteristics. In recent years, the reduction in size of mobile communications terminals requires a circuit that processes RF (Radio Frequency) signals, and an assembly of electronic components that constitutes the high-frequency circuit to be downsized. The circuit and the assembly of electronic components may be downsized by using a composite electronic component (sometimes referred to as a module) having functional elements such as filters or duplexers integrated and mounted on a single circuit substrate. Japanese Patent Application Publication No. 2002-198774 discloses a technique that mounts an element composed of a SAW filter, and a passive element such as a capacitor on a single substrate.

However, the conventional technique may form an open space between electronic components mounted on a circuit substrate depending on a configuration of an electronic circuit composed of the electronic components and the type of each electronic component. Such an open space may reduce a mechanical strength, especially a bending strength of the composite electronic component, and make the composite electronic component difficult to handle in a test equipment or to handle when mounted on an electronic device.

SUMMARY OF THE INVENTION

According to an aspect of the present invention, there is provided a composite electronic component including: a circuit board; a package that includes an acoustic wave filter and is located on a top surface of the circuit board; a dummy package that is located on the top surface of the circuit board; and a lid that is located above the package and the dummy package.

DETAILED DESCRIPTION

Figure 1:
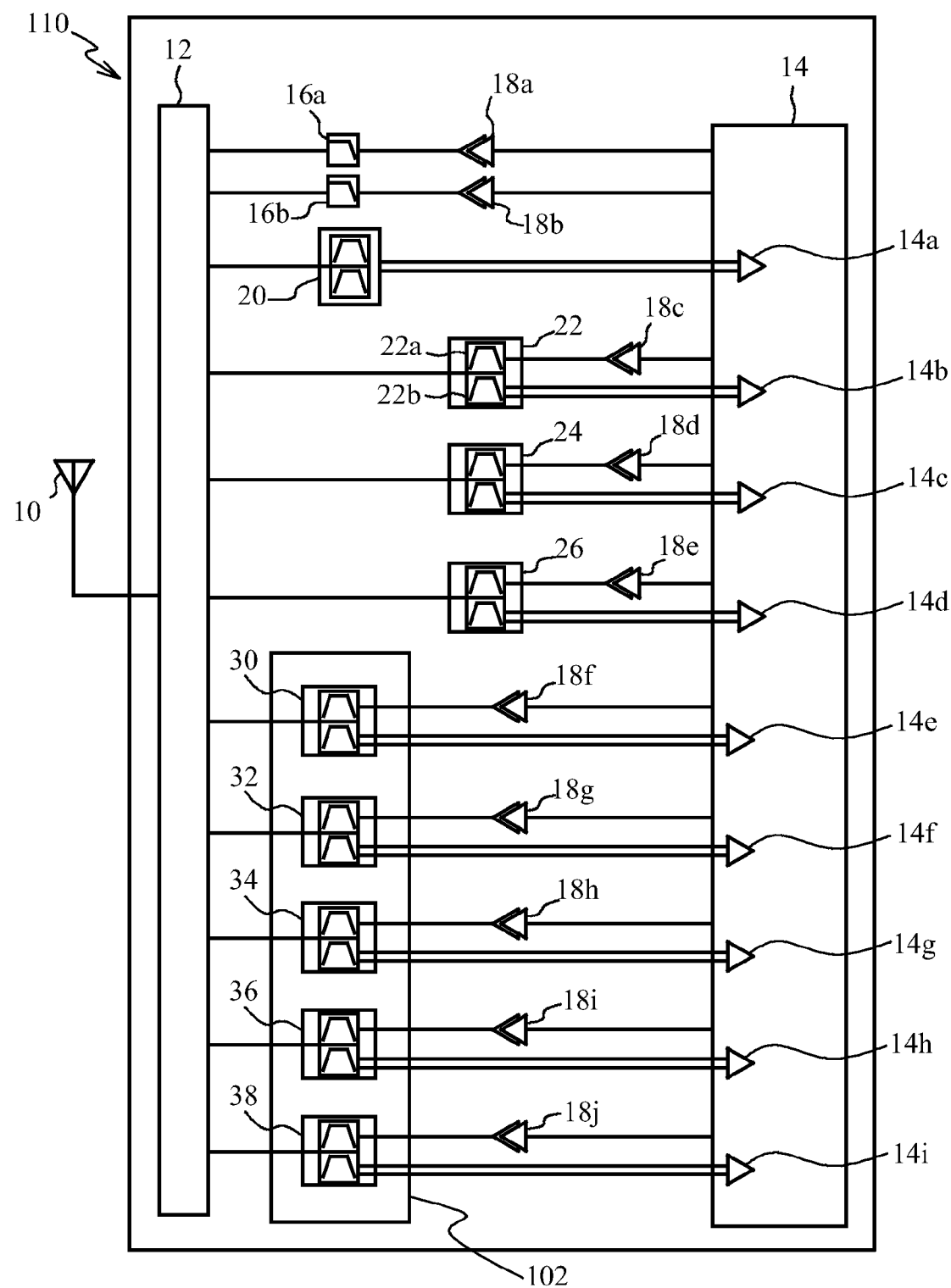
FIG. 1 is a block diagram illustrating a first RF circuit.

A description will first be given of an RF (Radio Frequency) circuit that processes RF signals. FIG. 1 is a block diagram illustrating a first RF circuit 110.

As illustrated in FIG. 1, the first RF circuit 110 includes an antenna 10, a switch 12, an IC (Integrated Circuit) 14, LPFs (Low Pass Filter) 16a and 16b, PAs (Power Amplifier) 18a through 18j, duplexers 20, 22, 24 and 26, and a composite electronic component (module) 102. The IC 14 includes LNAs (Low Noise Amplifier) 14a through 14i. The IC 14 functions as a direct converter that converts a frequency of a signal. The duplexer 22 includes a transmission filter 22a and a reception filter 22b. The composite electronic component 102 includes duplexers 30, 32, 34, 36 and 38. The duplexers in the composite electronic component 102 include a transmission filter and a reception filter as with the duplexer 20. The filters in the first RF circuit 110 are SAW filters for example. The filters included in the duplexer are bandpass filters for example.

A description will now be given of a band supported by each component. The LPF 16a supports the transmission band of GSM (Global System for Mobile Communication: registered trademark) 1800/1900. The LPF 16b supports the transmission band of GSM 850/900. The duplexer 20 supports the reception band of GSM. The duplexer 22 supports W-CDMA (Wideband Code Division Multiple Access) Band 8. The duplexer 24 supports GSM 900. The duplexer 26 supports GSM 850. The duplexer 30 supports W-CDMA Band 1. The duplexer 32 supports W-CDMA Band 2. The duplexer 34 supports W-CDMA Band 3. The duplexer 36 supports W-CDMA Band 4. The duplexer 38 supports W-CDMA Band 5.

The PA (Power Amplifier) 18a is connected between the IC 14 and the LPF 16a. The PA 18b is connected between the IC 14 and the LPF 16b. The duplexer 20 is coupled to the LNA 14a. The transmission filter 22a in the duplexer 22 is coupled to the PA 18c, and the reception filter 22b is coupled to the LNA 14b. The duplexer 24 is coupled to the PA 18d and the LNA 14c, and the duplexer 26 is coupled to the PA 18e and the LNA 14d. The duplexer 30 is coupled to the PA 18f and the LNA 14e, the duplexer 32 is coupled to the PA 18g and the LNA 14f, and the duplexer 34 is coupled to the PA 18h and the LNA 14g. The duplexer 36 is coupled to the PA 18i and the LNA 14h, and the duplexer 38 is coupled to the PA 18j and the LNA 14i.

The switch 12 selects one of the LPFs 16a and 16b and one of the duplexers in accordance with the communication method, and connects them to the antenna 10. For example, the IC 14 up-converts a baseband signal into an RF signal of W-CDMA Band 8 to generate a transmission signal. The transmission signal is amplified by the PA 18c, and is filtered by the transmission filter 22a in the duplexer 22. The transmission signal is transmitted through the antenna 10. A reception signal of W-CDMA Band 8 received by the antenna 10 is filtered by the reception filter 22b. The LNA 14b amplifies the reception signal, and the IC 14 down-converts the reception signal into the baseband signal.

Figure 2:
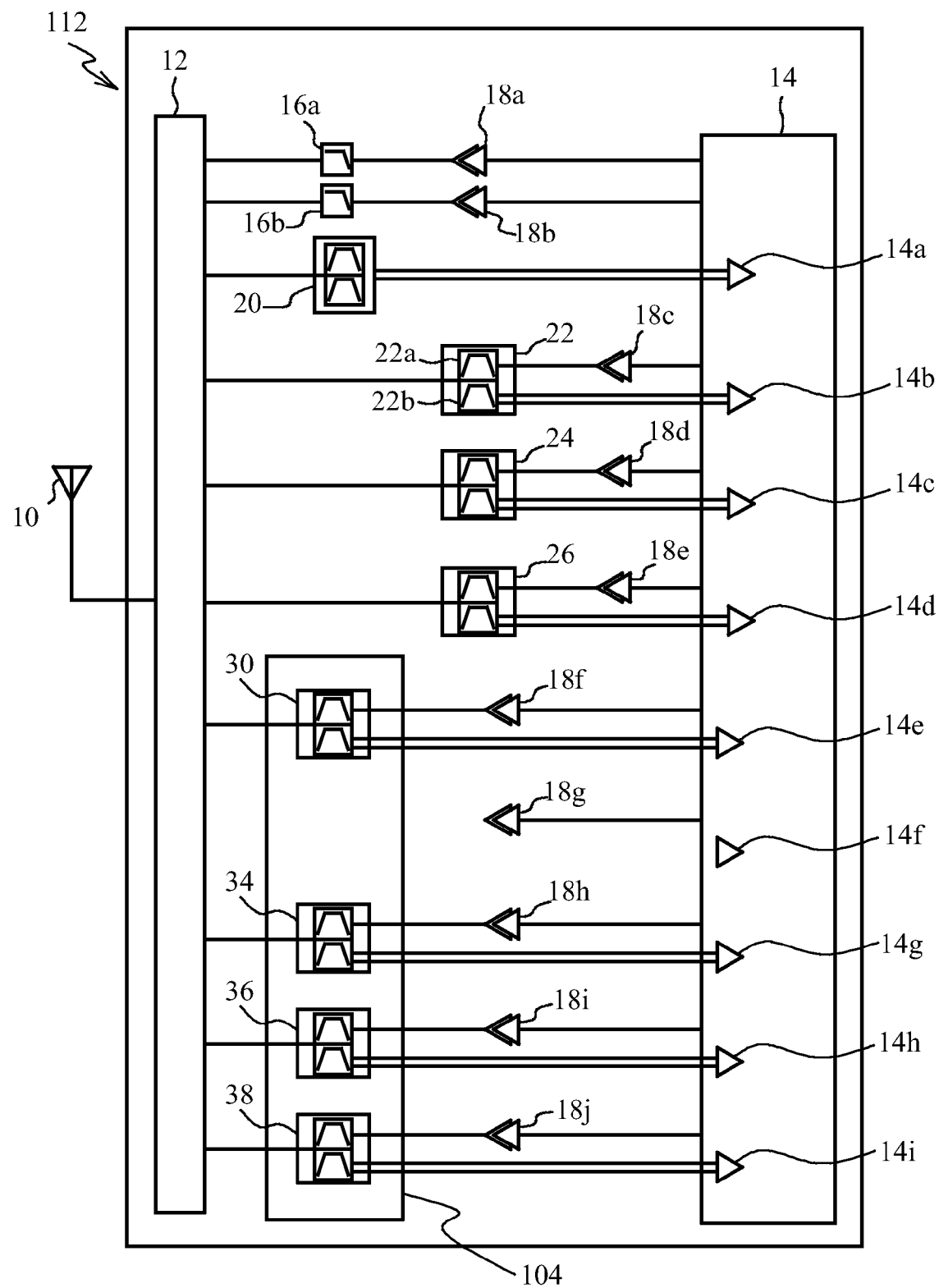
FIG. 2 is a block diagram illustrating a second RF circuit.

The circuit, and the numbers of filters and duplexers are changed in accordance with the communication method to be used or functions and configurations of the communication terminal. A second RF circuit 112 is disclosed as an example of the RF circuit including filters and duplexers that differ in number from those of the first RF circuit 110. FIG. 2 is a block diagram illustrating the second RF circuit 112. As illustrated in FIG. 2, a composite electronic component 104 includes the duplexers 30, 34, 36 and 38, but does not include the duplexer 32 that is disposed in the composite electronic component 102 in the first RF circuit 110. Other circuit configurations are the same as those of the first RF circuit 110.

Figure 3A:
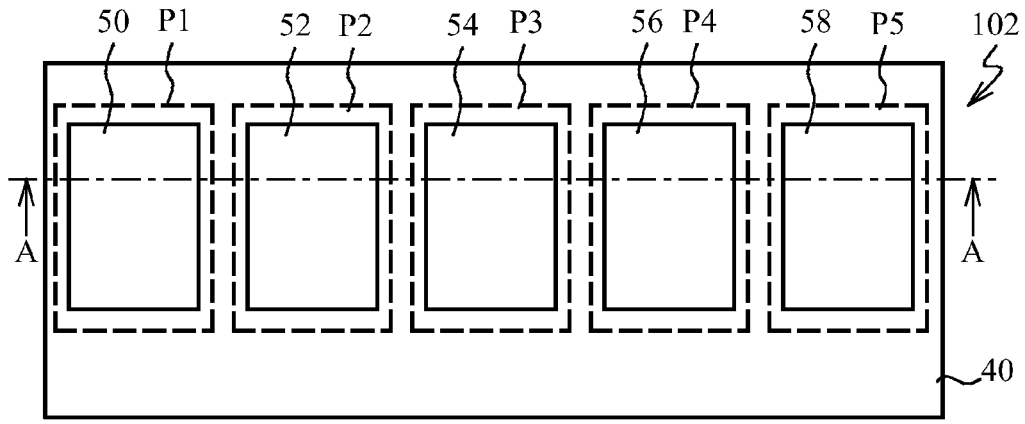
FIG. 3A is a top view illustrating a composite electronic component.
Figure 3B:
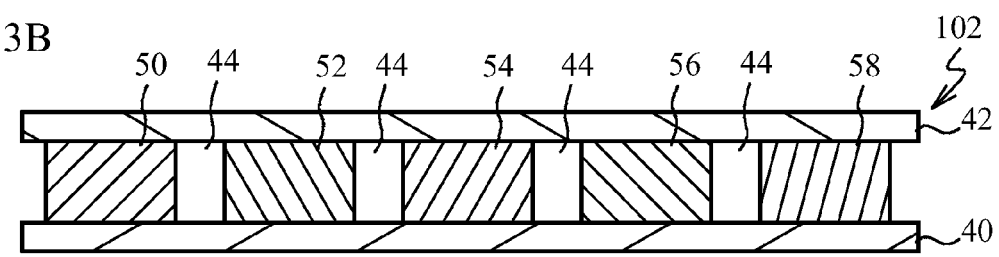
FIG. 3B is a cross-sectional view taken along line A-A in FIG. 3A.

Disclosed herein are configurations of the composite electronic component 102 in the first RF circuit 110 and the composite electronic component 104 in the second RF circuit 112. FIG. 3A is a top view illustrating the composite electronic component 102. FIG. 3B is a cross-sectional view taken along line A-A in FIG. 3A. FIG. 3A illustrates a lid 42 transparently.

As illustrated in FIG. 3A and FIG. 3B, the composite electronic component 102 includes a circuit board 40 having a rectangular planar shape, the lid 42, and functional element packages 50, 52, 54, 56 and 58. Hereinafter, the functional element means an element that includes SAW filters and/or FBAR filters in a package and achieves a function that can not be achieved by a single SAW filter or FBAR filter, or an element that includes SAW filters and/or FBAR filters in a package and achieves a function of a duplexer. The above described functional element is inescapably heavier than a functional element that includes a single SAW filter or a single FBAR filter in a package.

The functional element packages 50, 52, 54, 56 and 58 include a duplexer, and are surface-mounted on a first principal surface of the circuit board 40 to form almost a line. Gaps 44 are formed between the mounted functional element packages. The centers of the functional element packages are arranged in a surface direction of the circuit board 40 (longitudinal direction in this embodiment). It is sufficient if the functional element packages are arranged on a line, and the centers of the functional element packages may not be arranged in the surface direction of the circuit board 40.

The lid 42 is a plate-shaped member that is located so as to cover the functional element packages, and is in contact with top surfaces of the functional element packages. A spacer that contacts the lid 42 is located so as to fill a gap between the lid 42 and the top surface of the functional element package of which the height is lower than those of the other functional element packages when mounted on the circuit board 40. The circuit board 40 is a printed circuit board including an insulating material such as an epoxy resin or a glass epoxy resin. The lid 42 is formed of a metal such as kovar, or an insulating material such as a resin, or of a complex of these. The composite electronic component 102 may include a chip component such as a capacitor mounted on the circuit board 40 in addition to the functional element packages.

As illustrated in FIG. 3A, mounted positions of the functional element packages 50, 52, 54, 56 and 58 on the top surface of the circuit board 40 are expressed with P1 through P5, respectively. The functional element packages arranged in the above described manner form gaps between the functional element packages mounted on the circuit board 40 so as to be apart from each other, and the circuit board 40 and the lid 42 form the gaps 44. The circuit board 40 and the lid 42 are located so as to protrude further out than outer edge portions of the functional element package 50 and the functional element package 58 that are located at both sides of the line of the functional element packages.

A drop test and a temperature cycle test are conducted as a reliability test of the composite electronic component 102. A test based on JIS C/IEC 60068-2-32 is conducted as the drop test for example. This test mounts a composite electronic component to be tested on a plate-shaped jig that is used as a mother board, and drops it to a cement ground from 1 m of height three times. The above described drop test is conducted to all six sides of the plate-shaped jig. In the composite electronic component 102 illustrated in FIG. 3A and FIG. 3B, the functional element packages are mounted on the top surface of the circuit board 40, and are arranged at approximately equal intervals in the longitudinal direction of the circuit board 40. Therefore, the center of gravity of the composite electronic component 102 is located approximately at a planimetrically center part of the circuit board 40. Therefore, the drop impact is applied almost evenly to the functional element packages.

The temperature cycle test repeats heating of the composite electronic component from a room temperature to a given temperature and cooling from the given temperature to the room temperature. In the temperature cycle test, a tensile stress in a lateral direction, e.g. the longitudinal directions of the circuit board 40 and the lid 42, is produced in the functional element packages because of the thermal expansion of the circuit board 40 and the lid 42 in the composite electronic component 102. As the functional element packages are mounted and arranged on the circuit board 40 at approximately equal intervals in the composite electronic component 102, the stress is applied almost evenly to the functional element packages.

Figure 3C:
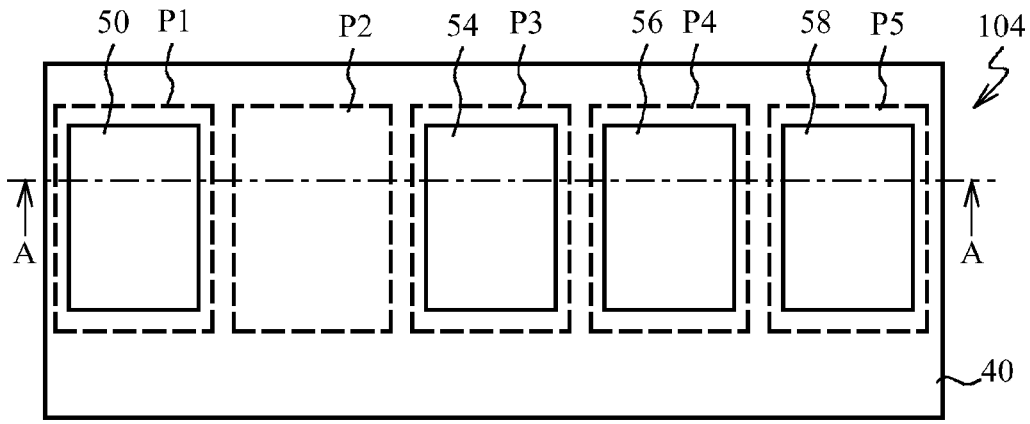
FIG. 3C is a top view illustrating a composite electronic component.
Figure 3D:
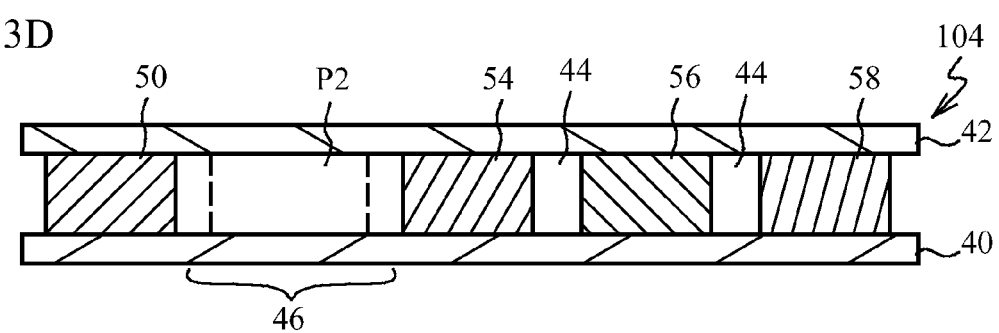
FIG. 3D is a cross-sectional view taken along line A-A in FIG. 3C.

FIG. 3C is a top view illustrating the composite electronic component 104. FIG. 3D is a cross-sectional view taken along line A-A in FIG. 3C.

As illustrated in FIG. 3C and FIG. 3D, in the composite electronic component 104, the functional element package 52 that contains the duplexer 32 is not mounted on the circuit board 40. The above described configuration makes the mounted position P2 empty, and forms an open space 46, which is larger than the gap 44, between the functional element package 50 and the functional element package 54.

That is to say, the composite electronic component 104 illustrated in FIG. 3C and FIG. 3D does not arrange the functional element packages at approximately equal intervals in the longitudinal direction of the circuit board 40, and accordingly, the functional element packages are unevenly arranged on the circuit board 40. In the drawings, since the functional element packages is concentrated in the right half, the center of gravity is located further right than the center part of the circuit board 40.

When the composite electronic component 104 with the above configuration undergoes the drop test, the plate-shaped jig to which the composite electronic component 104 is mounted hits the concrete surface in various directions, but the stress due to the impact is not distributed evenly to the functional element packages, and the functional element package 50 is subjected to a maximum stress. The reason is as follows. Parts of the circuit board 40 and the lid 42 that freely vibrate are large because of the open space 46. Thus, the drop impact causes a first stress that causes the circuit board 40 and the lid 42 to vibrate in the vertical direction in the drawings, the first stress causes a second stress that causes free end portions of the circuit board 40 and the lid 42, which are located at a left end in FIG. 3D, to vibrate, and the second stress is applied to the functional element package 50. On the other hand, the functional element packages 54, 56 and 58 are bonded to the circuit board 40 and the lid 42. Therefore, even though the drop impact is applied to them, the free ends of the circuit board 40 and the lid 42 located at a right end in FIG. 3D hardly vibrate, and a failure hardly occurs. As described above, only the functional element package 50 is exposed to the vibration, and accordingly, the stress is strongly applied to the functional element package 50, and easily causes the failure. The failure is a bad connection between a terminal of the functional element package 50 and a terminal of the circuit board 40 for example.

In addition, when the open space 46 is formed, the stress in the temperature cycle test concentrates at the free end as described previously, is strongly applied to the functional element package 50, and easily causes the failure. As described above, the composite electronic component 104 has a low mechanical strength compared to the composite electronic component 102. When the composite electronic component 104 is picked up by a suction collet (not illustrated) and moved to a given position, the suction collet may be rotated at high speed. However, if the composite electronic component 104 has an eccentric center of gravity, the composite electronic component 104 may disengage from the suction collet, and the fabrication yield may decrease.

Figure 4A:
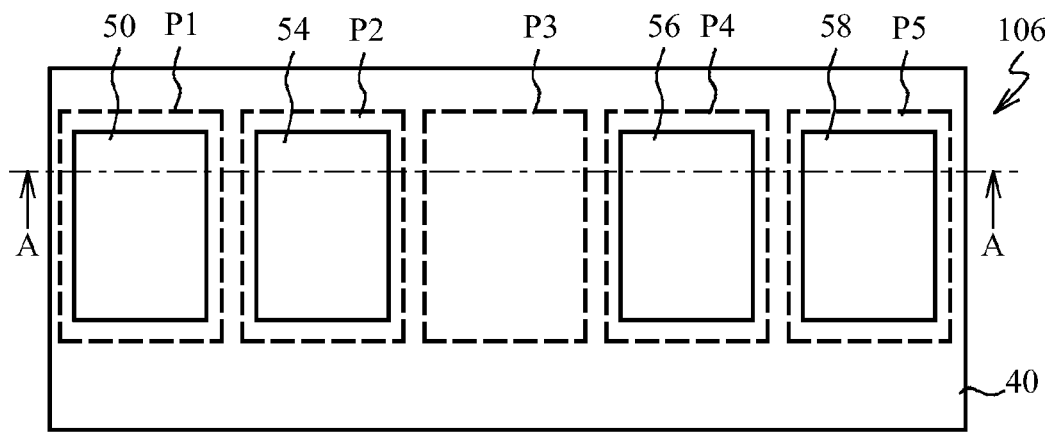
FIG. 4A is a top view illustrating a composite electronic component.
Figure 4B:
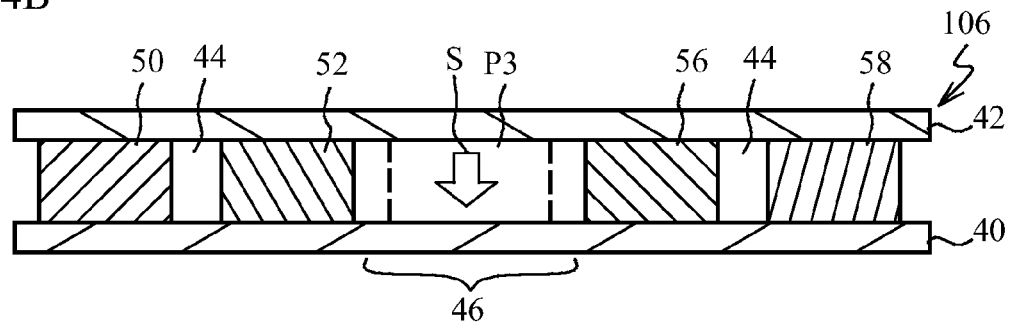
FIG. 4B is a cross-sectional view taken along line A-A in FIG. 4A.

In addition to the composite electronic component 104, the mechanical strength is also reduced in the composite electronic component that does not have the functional element package mounted on its mounted position on the circuit board 40. A description will now be given of a composite electronic component 106 different from the composite electronic component 104 in that it has the open space 46 in the mounted position P3 of the functional element package 54. FIG. 4A is a top view illustrating the composite electronic component 106. FIG. 4B is a cross-sectional view taken along line A-A in FIG. 4A.

As illustrated in FIG. 4A and FIG. 4B, in the composite electronic component 106, the open space 46 on which the functional element package 54 is not mounted is located at almost the center part of the circuit board 40 in the longitudinal direction. This corresponds to a circuit not including the duplexer 34 corresponding to the functional element package 54. Therefore, the stress due to the drop impact causes the circuit board 40 and the lid 42 to vibrate in the vertical direction as described previously, and thus the stress is applied to the functional element packages 52 and 56. Accordingly, the composite electronic component 106 has a low mechanical strength. However, the stress is received by two functional element packages 52 and 56, and thus the level of defectiveness of the composite electronic component 106 is lower than that of the composite electronic component 104. In addition, in the open space 46, the lid 42 is not supported by the functional element package, and thus the lid 42 easily sags along arrow S in FIG. 4B. When the suction collet is used to deliver the composite electronic component 106 in the fabrication process, the suction by the suction collet becomes difficult if the lid 42 sags.

Figure 5A:
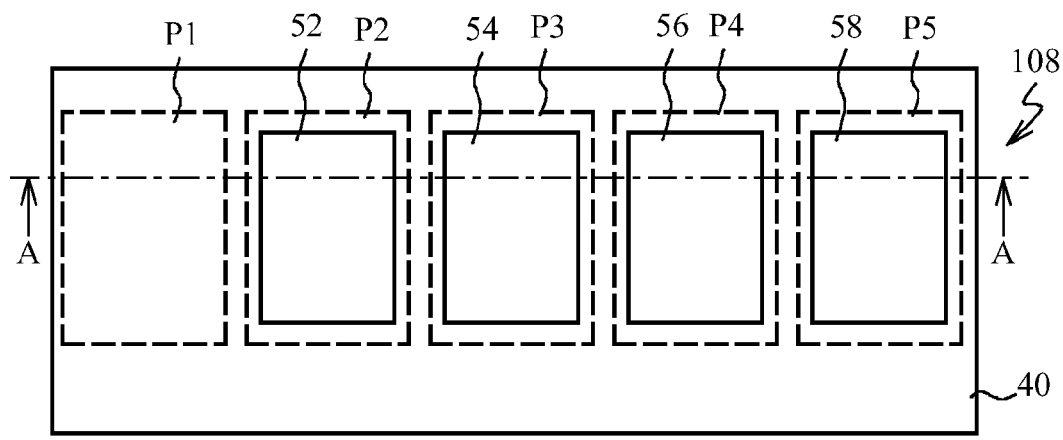
FIG. 5A is a top view illustrating a composite electronic component.
Figure 5B:
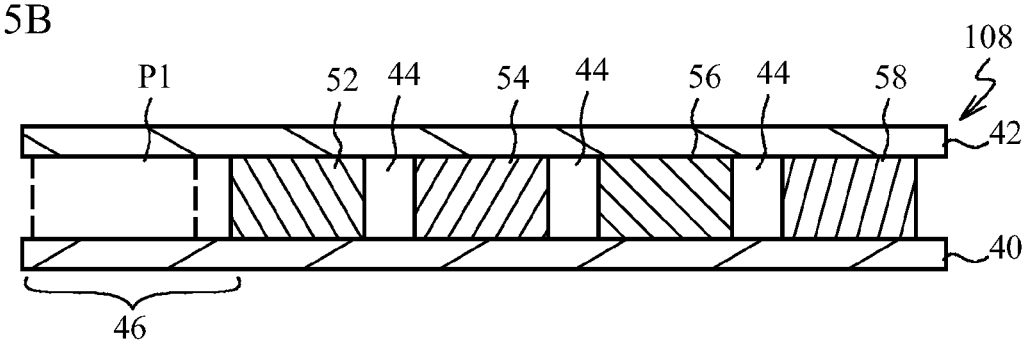
FIG. 5B is a cross-sectional view taken along line A-A in FIG. 5A.
Figure 5C:
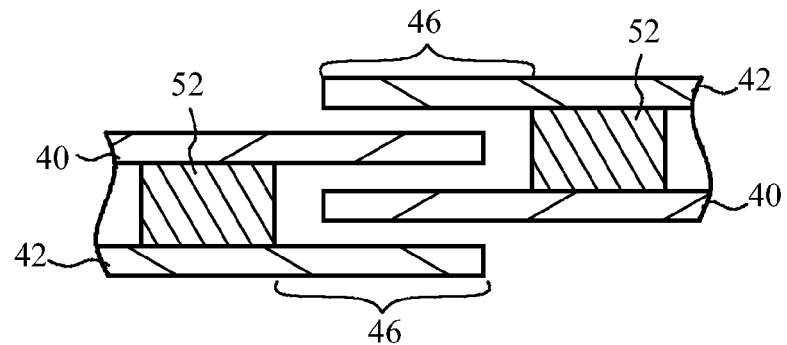
FIG. 5C is a diagram illustrating a state where composite electronic components get stuck in each other.

A description will now be given of another composite electronic component 108 that has the open space 46 in the mounted position P1 of the functional element package 50. FIG. 5A is a top view illustrating the composite electronic component 108. FIG. 5B is a cross-sectional view taken along line A-A in FIG. 5A. FIG. 5C is a diagram illustrating a state where the composite electronic components get stuck in each other.

As illustrated in FIG. 5A and FIG. 5B, in the composite electronic component 108, the open space 46 in which the functional element package 50 is not mounted is located at a first end portion of the circuit board 40 in the longitudinal direction. This corresponds to a circuit not including the duplexer 30 corresponding to the functional element package 50. Therefore, the open space 46 is formed near the first end portion of the circuit board 40 in the longitudinal direction. That is to say, the circuit board 40 and the lid 42 facing each other across the open space 46 are not mechanically supported by the functional element package, and the stress due to the impact by the drop test reduces a mechanical strength of the composite electronic component 108 as with the composite electronic component 104 illustrated in FIG. 3C and FIG. 3D. In this case, the functional element package 52 receives the maximum stress, but the level of defectiveness is lower than that of FIG. 3C and FIG. 3D.

In addition, when the open space 46 is formed near the end portion of the circuit board 40 in the longitudinal direction, the circuit board 40 or the lid 42 of the composite electronic component 108 enters the open space 46 of another composite electronic component 108, and the composite electronic components 108 may get stuck in each other as illustrated in FIG. 5C. Such a phenomenon easily occurs in a parts feeder used to locate the composite electronic components 108 on a mother board of a mobile phone for example. The parts feeder temporarily stocks electronic components oriented in a random direction, then changes orientations of the electronic components to the same, and delivers them with a collet. The state illustrated in FIG. 5C easily occurs when the composite electronic components 108 are stocked with being oriented in the random direction.

The previously described functional element package, which includes a functional element such as an acoustic wave filter or a duplexer, is heavy compared to a chip component such as a capacitor. Therefore, the center of gravity greatly shifts and the non-uniform distribution of the drop impact increases depending on a mounted way of the functional element packages in the composite electronic component. The area occupied by a single functional element package in the composite electronic component is large compared to the area occupied by a chip component. Therefore, a relatively large recess is easily formed in the lid 42. In addition, when the gaps 44 and the open space 46 are not filled with a resin or the like, the circuit board 40 and the lid 42 vibrate, the non-uniform distribution of the stress due to the impact increases, and the mechanical strength of the composite electronic component greatly decreases. Furthermore, the lid 42 easily sags and the composite electronic components easily get stuck in each other. The present invention aims to provide a configuration capable of preventing reduction in mechanical strength of a composite electronic component including functional element packages mounted on the circuit board 40 to form the open space 46 around them. Hereinafter, a description will be given of embodiments of the present invention.

First Embodiment

Figure 6A:
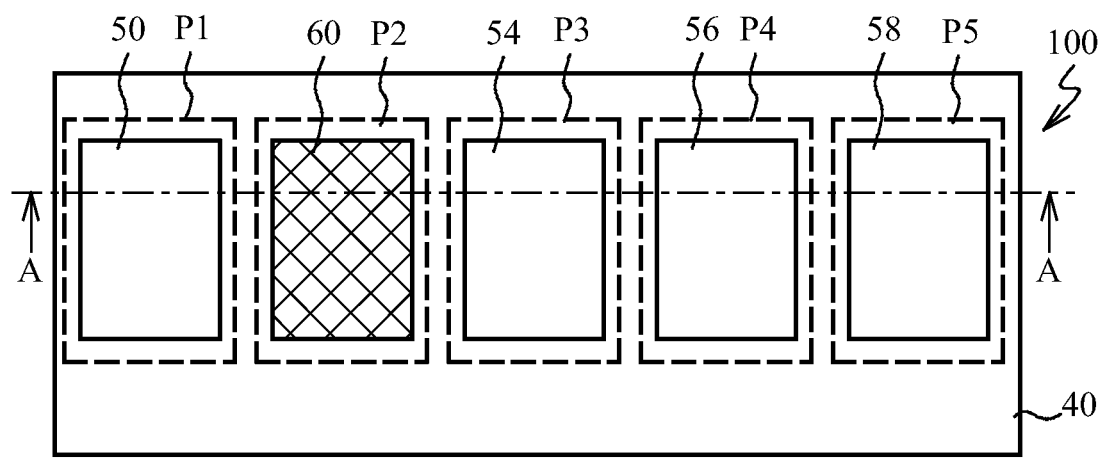
FIG. 6A is a top view illustrating a composite electronic component in accordance with a first embodiment.
Figure 6B:
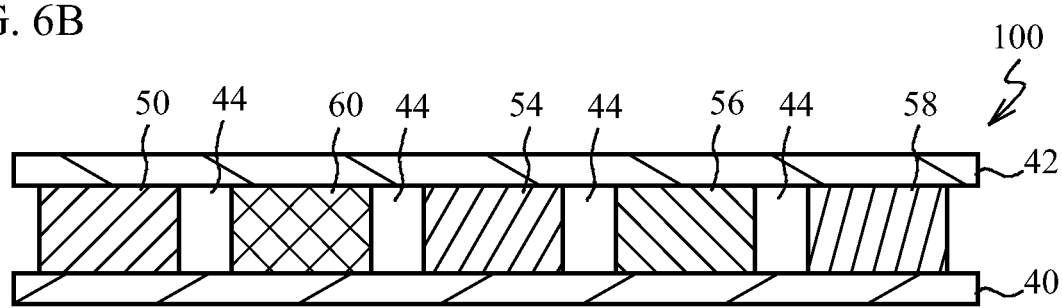
FIG. 6B is a cross-sectional view taken along line A-A in FIG. 6A.

A first embodiment discloses a composite electronic component 100 that has a dummy package 60 mounted in the position on which the functional element package is not mounted (mounted position P2) in the circuit board 40. FIG. 6A is a top view illustrating the composite electronic component 100 in accordance with the first embodiment. FIG. 6B is a cross-sectional view taken along line A-A in FIG. 6A.

As illustrated in FIG. 6A, four functional element packages 50, 54, 56 and 58, and the dummy package 60 are mounted and arranged to form a line in the longitudinal direction of the circuit board 40. The dummy package 60 is located at the mounted position P2 that is apart from the center of the circuit board 40. That is to say, the dummy package 60 is mounted and arranged in the mounted position P2 between the functional element package 50 and the functional element package 54. The lid 42 is located so as to cover the functional element packages and the dummy package 60. The open space 46 described previously is not formed between the functional element package 50 and the functional element package 54 because the dummy package 60 is provided. The gaps 44 exist between the dummy package 60 and the functional element package 50, and between the dummy package 60 and the functional element package 54. The gaps 44 are as narrow as those between other functional element packages. Accordingly, the gaps 44 between the adjoining functional element packages have the same size as that of the gap 44 between the dummy package 60 and the functional element package. The gaps 44 are preferably as uniform as possible.

The first embodiment allows the composite electronic component 100 to have the center of gravity at or close to the center part of the circuit board 40 by providing the dummy package 60. Therefore, the drop impact is applied approximately evenly to the functional element packages and the dummy package 60. This is because the circuit board 40 and the lid 42 do not vibrate in the vertical direction in the drawing and the stress due to the vibration does not occur. In addition, in the temperature cycle test, the uniformity of the distribution of the stress to the functional element packages and the dummy package 60 increases. As described above, the mechanical strength of the composite electronic component 100 is improved.

The dummy package 60 preferably has an outside dimension and a weight approximately identical to those of the functional element package. The approximately identical weight means the identical weight or a weight highly close to the identical weight. That is to say, when the dummy package 60 has an outside dimension and a weight approximately identical to those of the functional element package, the position of the center of gravity becomes easily determined in the composite electronic component 100. In addition, use of a defective functional element package that has been picked up in other fabrication steps, i.e. a functional element package that does not meet the required specification or does not operate, as the dummy package 60 is effective to improve cost efficiency. A non-defective functional element package may be used for the dummy package 60. In this case, an electrical function of the non-defective functional element package is disabled, or taken is a measure for deactivating the electrical function of the dummy package 60 (the non-defective functional element package) in the circuit board 40 or for preventing it from operating on the mother board of the mobile phone before the non-defective functional element package is used. Cutting (e.g. laser trimming) the wiring on the substrate or not electrically connecting the dummy package that is a non-defective functional element package to the substrate is an example of the measure taken in the circuit board 40 for deactivating the electrical function of the dummy package 60. Furthermore, the dummy package 60 may be a solid material that is made of an organic material such as a resin, an inorganic material such as ceramic, or a metal, and to which a fixing terminal to the circuit board 40 is provided as necessary.

Figure 7A:
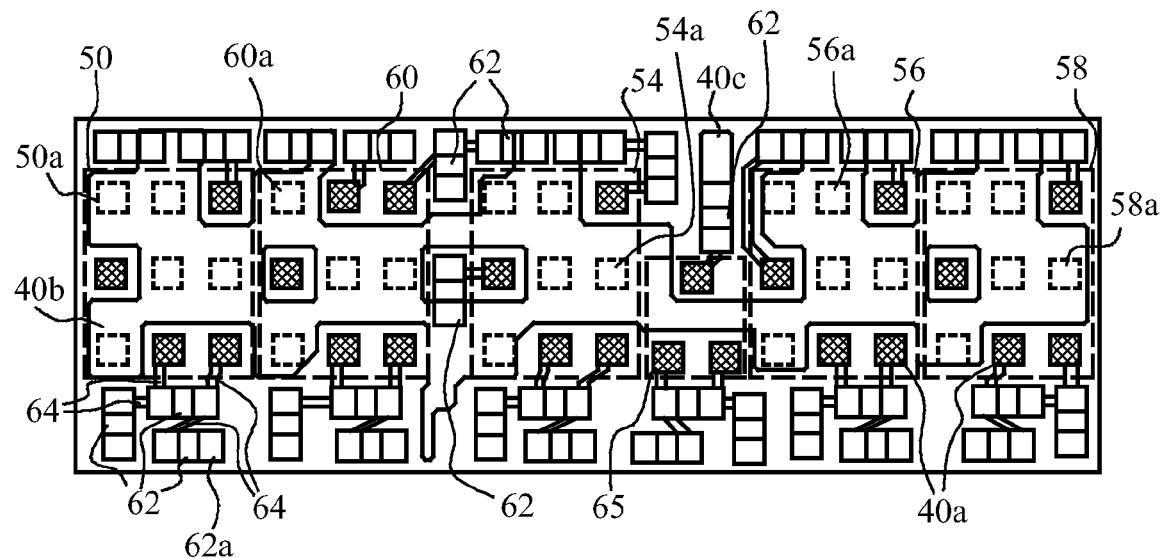
FIG. 7A is a top view illustrating functional element packages and a dummy package transparently in the composite electronic component.
Figure 7B:
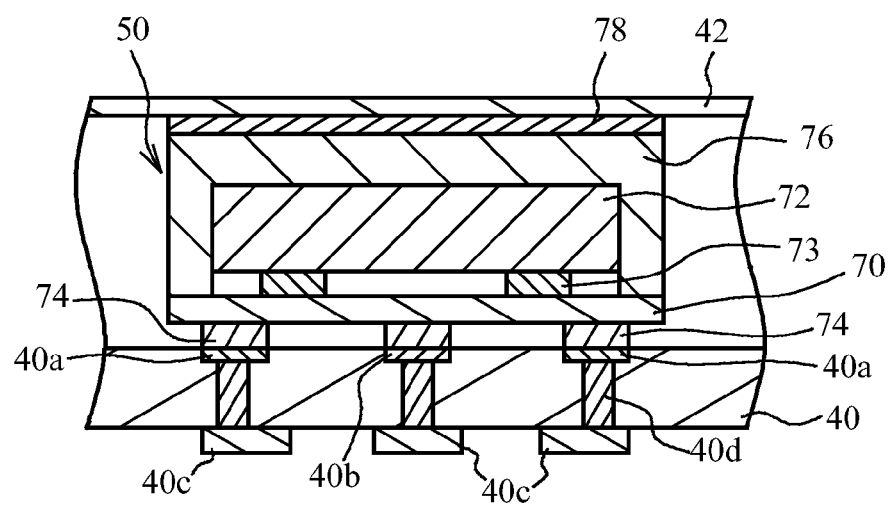
FIG. 7B is a cross-sectional view illustrating the functional element package.

Here, a description will be given of a case where the composite electronic component 100 includes a chip component 62 in addition to the functional element packages. FIG. 7A is a top view illustrating the functional element packages and the dummy package 60 transparently in the composite electronic component 100. The packages and the dummy package 60 are illustrated transparently with dashed lines. In FIG. 7A, reference numerals are affixed to some of signal terminals 40a, ground terminals of the functional element packages, the chip components 62, solder coated terminals 62a, and wirings 64. The signal terminals 40a are hatched. FIG. 7B is a cross-sectional view illustrating the functional element package 50.

As illustrated in FIG. 7A, the chip components 62 are mounted on the top surface of the circuit board 40, on which the functional element packages 50, 54, 56 and 58, and the dummy package 60 are mounted and arranged, with the solder coated terminals 62a. The chip components 62 include individual passive elements such as a capacitor or an inductor. A SAW filter chip 65 illustrated with a dashed line is mounted between the functional element package 54 and the functional element package 56. The signal terminals 40a, ground terminals 40b, and the wirings 64 are located on the top surface of the circuit board 40. The signal terminals 40a are connected to signal terminals (not illustrated) of the functional element packages and dummy package 60. The ground terminals 40b are provided so as to cross the functional element packages and the dummy package 60. The ground terminals 40b are coupled to ground terminals 50a, 54a, 56a and 58a of the functional element package 50, 54, 56 and 58 illustrated with dotted lines, and to a ground terminal 60a of the dummy package 60. The signal terminals 40a and the ground terminals 40b are only mechanically coupled to the dummy package 60, and does not affect the electrical operation of the composite electronic component 100. The wirings 64 couple the chip components 62 with the signal terminals 40a, and interconnect the chip components 62.

As illustrated in FIG. 7B, the functional element package 50 includes a substrate 70, a duplexer chip 72, bumps 73 and solders 74, a sealing portion 76, and an adhesive compound 78. The duplexer chip 72 is a chip that includes an acoustic wave filter such as a SAW filter with an IDT (Interdigital Transducer) or an FBAR filter, for example. The duplexer chip 72 is flip-chip mounted on the substrate 70 with the bumps 73. The sealing portion 76 and the lid 42 seal the duplexer chip 72. The substrate 70 is formed of an insulating material such as ceramic. The bumps 73 are formed of a metal such as gold (Au). The solder 74 is formed of solder containing silver tin (Sn—Ag based solder) for example. The sealing portion 76 is formed of solder or an epoxy resin. The adhesive compound 78 bonds the lid 42 to the sealing portion 76.

The signal terminals 40a and the ground terminals 40b are located on the first principal surface (top surface) of the circuit board 40, and foot pads (external connection terminals) 40c are located on a second principal surface (bottom surface) of the circuit board 40. The signal terminals 40a and the ground terminals 40b are coupled to the foot pads 40c via wirings 40d that pierce through the circuit board 40. In the drawing, two of the three solders 74 in the functional element package 50 are connected to the signal terminals 40a, and the other one is connected to the ground terminal 40b. The functional element packages 54, 56 and 58, and the dummy package 60 have the same terminal configuration as that of the functional element package 50. The dummy package 60 may not include the duplexer chip 72, and may be a solid body made of a resin or ceramic, or of a solder body, to which a terminal is provided.

As illustrated in FIG. 7A, the dummy package 60 is preferably firmly mechanically connected to the terminals (the signal terminal 40a and the ground terminal 40b) of the circuit board 40. This enables the drop impact and the stress to be distributed more evenly. The functional element packages and the dummy package 60 include the duplexer chip 72, but may include a filter chip including an acoustic wave filter for example. The number of packages and the number of the chip components 62 may be changed. The circuit board 40 may be a multilayered substrate that is formed by stacking insulating layers. The lid 42 may be formed of a metal, an insulating material such as resin, or composite body of these. When the lid 42 includes a metal, it functions as a shield that blocks out noise. When the lid 42 is connected to a ground terminal 62b or 62c, it functions as the shield more effectively. When the lid 42 includes a metal, accumulation of static electricity is reduced. When the lid 42 includes an insulating material, its cost and weight is reduced compared to when the entire of the lid 42 is formed of a metal.

The composite electronic component 100 has a planar size of 10.4 mm×3.6 mm for example. Each of the functional element packages and the dummy package 60 has a planar size of 2.0 mm×1.6 mm for example. The chip component 62 has a planar size of 0.6 mm×0.3 mm for example. The size of each component may be changed.

Second Embodiment

Figure 8A:
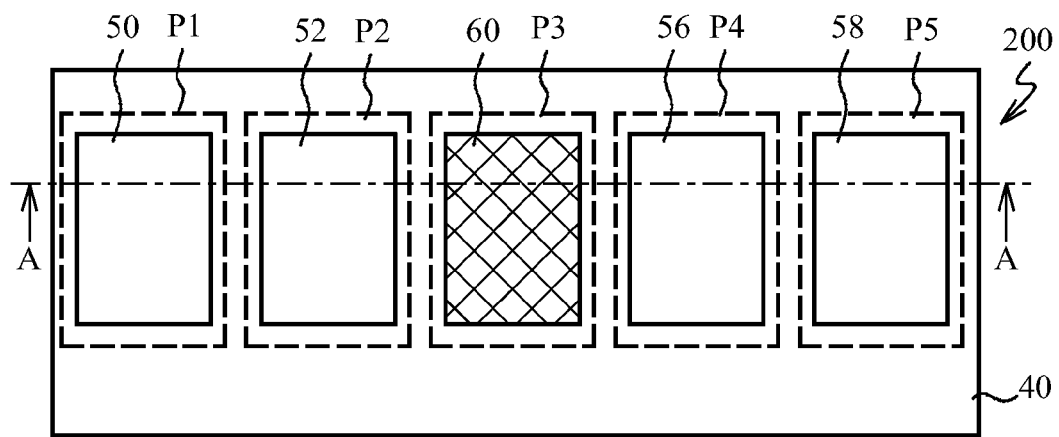
FIG. 8A is a top view illustrating a composite electronic component in accordance with a second embodiment.
Figure 8B:
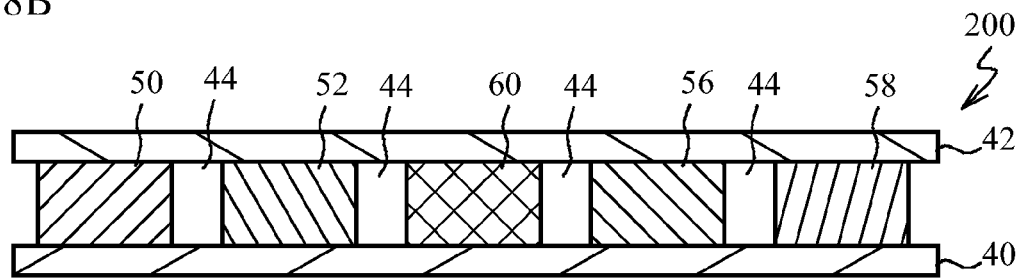
FIG. 8B is a cross-sectional view taken along line A-A in FIG. 8A.

A second embodiment discloses a composite electronic component 200 including the dummy package 60 at the center part of the circuit board 40 in the longitudinal direction. FIG. 8A is a top view illustrating the composite electronic component 200 in accordance with the second embodiment. FIG. 8B is a cross-sectional view taken along line A-A in FIG. 8A.

As illustrated in FIG. 8A and FIG. 8B, in the composite electronic component 200, the dummy package 60 is mounted and arranged at the center part of the circuit board 40 (mounted position P3), i.e. between the functional element package 52 and the functional element package 56. Other configurations are the same as those of the composite electronic component 102.

In the composite electronic component 200 of the second embodiment, the dummy package 60 prevents the open space from being formed at the mounted position P3 that is the center part of the circuit board 40 in the longitudinal direction, and supports the lid 42. Therefore, the lid 42 is prevented from sagging. This allows the flatness of the lid 42 to be improved, the mechanical strength of the composite electronic component 200 to increase, and the suction by the suction collet to be executed favorably. Therefore, the fabrication yield ratio is greatly improved.

Third Embodiment

Figure 9A:
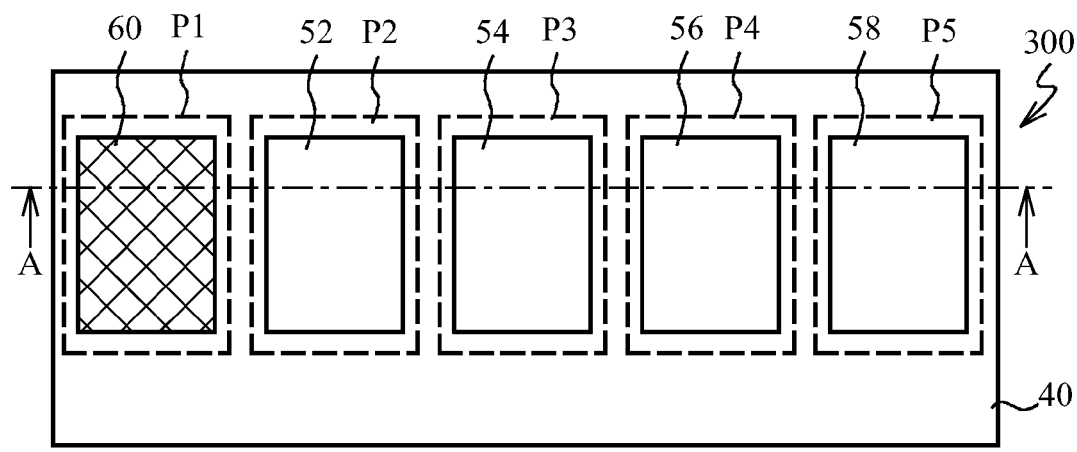
FIG. 9A is a top view illustrating a composite electronic component in accordance with a third embodiment.
Figure 9B:
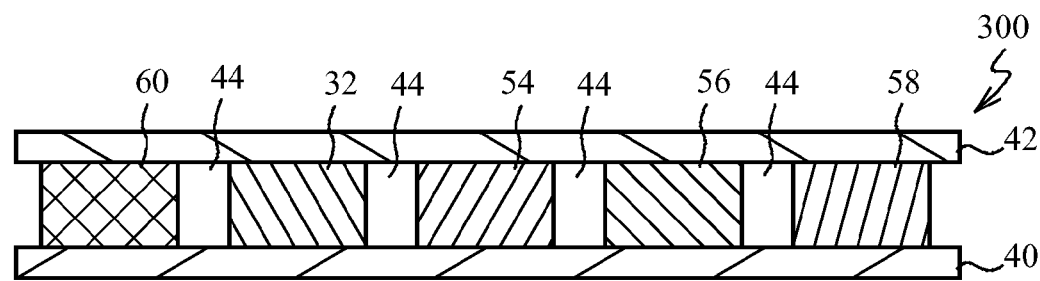
FIG. 9B is a cross-sectional view taken along line A-A in FIG. 9A.

A third embodiment discloses a composite electronic component 300 that includes the dummy package 60 in a peripheral portion (end portion in the longitudinal direction) of the circuit board 40. FIG. 9A is a top view illustrating the composite electronic component 300 in accordance with the third embodiment. FIG. 9B is a cross-sectional view taken along line A-A in FIG. 9A.

As illustrated in FIG. 9A and FIG. 9B, in the composite electronic component 300, the dummy package 60 is mounted and arranged at the first end portion (mounted position P1) of the circuit board 40. That is to say, the dummy package 60 is located further out than the functional element package 52. This prevents the open space from being formed in the peripheral portion of the circuit board 40. Therefore, the composite electronic components illustrated in FIG. 5C are prevented from getting stuck in each other. As with the first embodiment, the impact and the stress are distributed evenly, and the composite electronic component 300 has a high mechanical strength.

The composite electronic components described in the second and third embodiments may be the composite electronic component including the chip component 62 illustrated in FIG. 7A. The sum of the number of the functional element packages and the number of the dummy packages 60 mounted in the composite electronic component is not limited, and may be four or less, or six or more. The number of the dummy packages 60 mounted on the single circuit board 40 may be two or more, and the dummy packages 60 may be mounted and arranged in two or more regions in accordance with the shape and area of the circuit board 40 and the arrangement of the functional element packages. The functional element packages and the dummy package 60 may be arranged in a shorter direction of the circuit board 40. The dummy package 60 may be located in the end portion in the shorter direction. The gaps between the functional element packages and between the functional element package and the dummy package 60 mounted on the circuit board 40 may be filled with a resin to the extent that the resin does not reach the lid 42. This enhances the mechanical strength of the composite electronic component. When the gaps 44 are formed between the functional element packages, the mechanical strength is tends to be reduced. Therefore, the application of the first through third embodiments is effective.

Although the embodiments of the present invention have been described in detail, it is to be understood that the various change, substitutions, and alterations could be made hereto without departing from the spirit and scope of the invention.

What is claimed is:

1. A composite electronic component, comprising:
a circuit board having a rectangular planar shape;
a plurality of packages that include acoustic wave filters respectively, located on a top surface of the circuit board;
a dummy package that is located on the top surface of the circuit board and between two packages among the plurality of packages and apart from a center part of the circuit board; and
a lid that is located above the plurality of packages and the dummy package,
wherein at least five of the plurality of packages and the dummy package are arranged in a longitudinal direction of the rectangular planar shape of the circuit board, and the plurality of packages and the dummy package are not arranged in a width direction of the rectangular planar shape.

2. The composite electronic component according to claim 1, wherein
a gap is formed between each of the two packages and the dummy package.

3. The composite electronic component according to claim 1, wherein
a gap is formed between the plurality of the packages.

4. The composite electronic component according to claim 1, wherein
the dummy package is a defective package.

5. The composite electronic component according to claim 1, wherein
the dummy package is a non-defective functional element package of which an electrical function is disabled.

6. The composite electronic component according to claim 1, wherein
the dummy package is a non-defective functional element package of which an electrical function is deactivated by a measure taken in the circuit board.

7. The composite electronic component according to claim 1, wherein
the dummy package is a solid material made of an organic material such as a resin, an inorganic material such as ceramic, or a metal, or a solder body.

8. The composite electronic component according to claim 1, wherein
the dummy package does not include an acoustic wave filter.

9. The composite electronic component according to claim 1, wherein
at least one of the plurality of packages includes a duplexer including at least two of the acoustic wave filters.

10. The composite electronic component according to claim 1, wherein
the dummy package has a weight identical to a weight of each of the plurality of packages.

11. The composite electronic component according to claim 1, wherein
the dummy package has an outside dimension identical to an outside dimension of the each of the plurality of packages.

12. The composite electronic component according to claim 1, wherein
a resin is filled between each of the two packages and the dummy package.

13. The composite electronic component according to claim 1, wherein the dummy package is not a center package among the plurality of package and the dummy package.

14. A composite electronic component, comprising:
a circuit board having a rectangular planar shape;
a plurality of packages that include acoustic wave filters respectively, located on a top surface of the circuit board, the plurality of packages being arranged in a longitudinal direction of the rectangular planar shape of the circuit board and being not arranged in a width direction of the rectangular planar shape;
a dummy package that is located on the top surface of the circuit board; and
a lid that is located on the plurality of packages and the dummy package so as to hold the plurality of packages and the dummy package,
wherein the lid is connected to the circuit board via only the plurality of packages and the dummy package.

15. A composite electronic component comprising:
a circuit board having a rectangular planar shape;
a plurality of packages that include acoustic wave filters respectively, located on a top surface of the circuit board, the plurality of packages being arranged in a longitudinal direction of the rectangular planar shape of the circuit board and being not arranged in a width direction of the rectangular planar shape;
a dummy package that is located on the top surface of the circuit board; and
a lid that is located on the plurality of packages and the dummy package so as to hold the plurality of packages and the dummy package,
wherein the lid does not contact with the circuit board.

16. A composite electronic component comprising:
a circuit board having a rectangular planar shape;
a plurality of packages that include acoustic wave filters respectively, located on a top surface of the circuit board, the plurality of packages being arranged in a longitudinal direction of the rectangular planar shape of the circuit board and being not arranged in a width direction of the rectangular planar shape;
a dummy package that is located on the top surface of the circuit board; and
a lid that is located on the plurality of packages and the dummy package so as to hold the plurality of packages and the dummy package,
wherein the lid is not electrically connected to a ground potential.

* * * * *